(12) United States Patent
Yen

(10) Patent No.: US 8,279,155 B2
(45) Date of Patent: Oct. 2, 2012

(54) SOURCE DRIVER AND DISPLAY UTILIZING THE SOURCE DRIVER

(75) Inventor: Yu-Jen Yen, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 693 days.

(21) Appl. No.: 12/463,436

(22) Filed: May 11, 2009

(65) Prior Publication Data

US 2010/0283772 A1 Nov. 11, 2010

(51) Int. Cl.
*G09G 3/36* (2006.01)
(52) U.S. Cl. .......................................... 345/100; 345/98
(58) Field of Classification Search ................... 345/98, 345/100, 204
See application file for complete search history.

(56) References Cited

U.S. PATENT DOCUMENTS

| 5,543,744 | A | | 8/1996 | Okumura | |
|---|---|---|---|---|---|
| 5,621,342 | A | * | 4/1997 | Wong et al. | 327/108 |
| 5,929,656 | A | * | 7/1999 | Pagones | 326/83 |
| 2006/0284662 | A1 | * | 12/2006 | Suda et al. | 327/261 |
| 2009/0073148 | A1 | * | 3/2009 | Hsueh | 345/204 |
| 2010/0167678 | A1 | * | 7/2010 | Yoshikawa | 455/296 |

* cited by examiner

*Primary Examiner* — Kevin M Nguyen
(74) *Attorney, Agent, or Firm* — Winston Hsu; Scott Margo

(57) ABSTRACT

A source driver includes a receiver for receiving a digital signal at an input node to generate a received signal at an output node, and the receiver includes a first switch, a second switch, a voltage-limiting circuit and a channel. The first switch is utilized for selectively connecting the output node of the receiver to a first reference voltage based on the digital signal. The second switch is utilized for selectively connecting the output node of the receiver to a second reference voltage based on the digital signal. The voltage-limiting circuit is coupled between the input node and the output node of the receiver, and is utilized for limiting a voltage level of the input node of the receiver. The channel is utilized for generating a driving voltage based on the received signal.

14 Claims, 5 Drawing Sheets

US 8,279,155 B2

SOURCE DRIVER AND DISPLAY UTILIZING THE SOURCE DRIVER

BACKGROUND OF THE INVENTION

1. Field of the Invention

The present invention relates to a transmitter and a receiver, and more particularly, to a transmitter and a receiver of a display.

2. Description of the Prior Art

Please refer to FIG. 1. FIG. 1 is a diagram illustrating a transistor-transistor logic (TTL) interface 100. As shown in FIG. 1, the interface 100 includes a transmitter 110 and a receiver 120, where the receiver 120 receives a digital signal via a single data line L. In the TTL interface 100, however, the digital signal generally requires a large swing, therefore electro-magnetic interference (EMI) is more serious and an operating frequency is limited.

To solve the EMI and the operating frequency issues in TTL interface 100, a circuit for reduced swing differential signaling (RSDS) is utilized. FIG. 2 is a diagram illustrating a prior art circuit 200 for RSDS. As shown in FIG. 2, the circuit 200 includes a transmitter 210 and a receiver 220, where the receiver 220 is coupled to the transmitter 210 via a data line pair. The circuit 200 has better EMI and operating frequency due to smaller swings of signals carried on the data line pair. However, current sources $I_{s1}$ and $I_{s2}$ in the transmitter 210 require supplying higher currents (about 2 mA) to the data line pair, causing great power consumption. Furthermore, the number of data lines are doubled compared with the TTL interface 100, which increases the manufacturing cost.

SUMMARY OF THE INVENTION

It is therefore an objective of the present invention to provide a display comprising a timing controller and a source driver, where the display has better EMI and operating frequency, and less layout difficulty between the timing controller and the source driver, to solve the above-mentioned problems.

According to one embodiment of the present invention, a source driver comprises a receiver for receiving a digital signal at an input node to generate a received signal at an output node, and the receiver includes a first switch, a second switch, a voltage-limiting circuit and a channel. The first switch is utilized for selectively connecting the output node of the receiver to a first reference voltage based on the digital signal. The second switch is utilized for selectively connecting the output node of the receiver to a second reference voltage based on the digital signal. The voltage-limiting circuit is coupled between the input node and the output node of the receiver, and is utilized for limiting a voltage level of the input node of the receiver. The channel is utilized for generating a driving voltage based on the received signal.

According to another embodiment of the present invention, a display comprises a timing controller and a timing controller. The timing controller is utilized for receiving an input signal to generate a digital signal, and the source driver comprises a receiver, where the receiver is coupled to the output node of the inverter via a single data line and is utilized for receiving the digital signal from the transmitting circuit via the single data line. The timing controller includes an inverter, a first current source and a second current source. The inverter has an input node for receiving the input signal and generating the digital signal at an output node. The first current source is utilized for supplying a first current to a first power node of the inverter. The second current source is utilized for supplying a second current to a second power node of the inverter.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
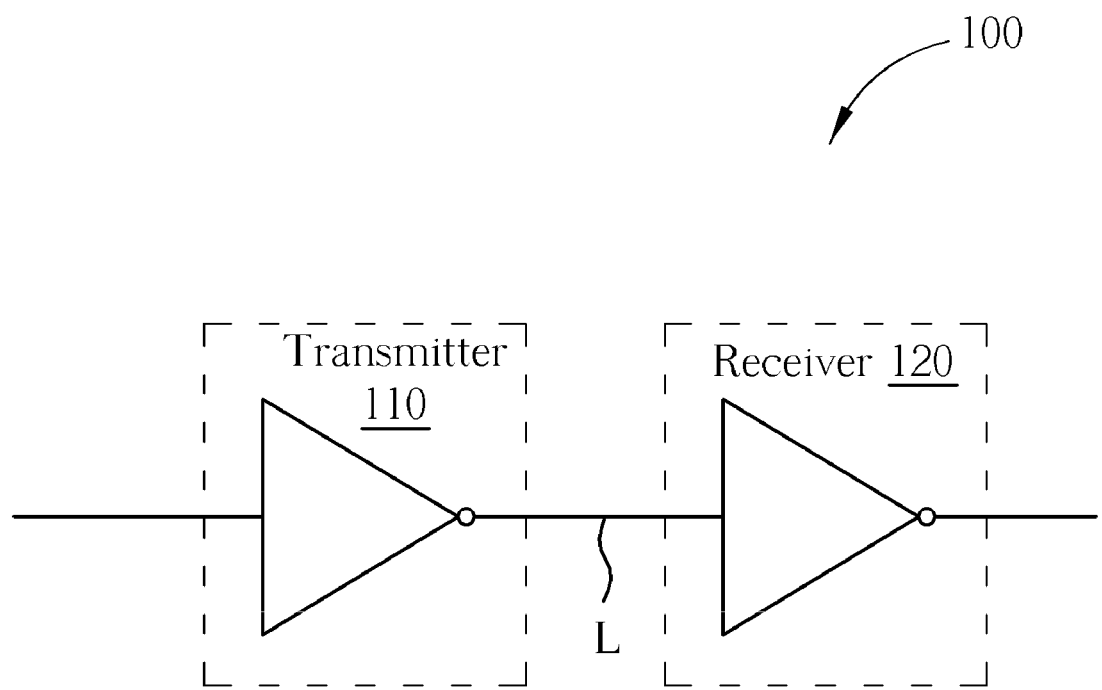
FIG. 1 is a diagram illustrating a TTL.
Figure 2:
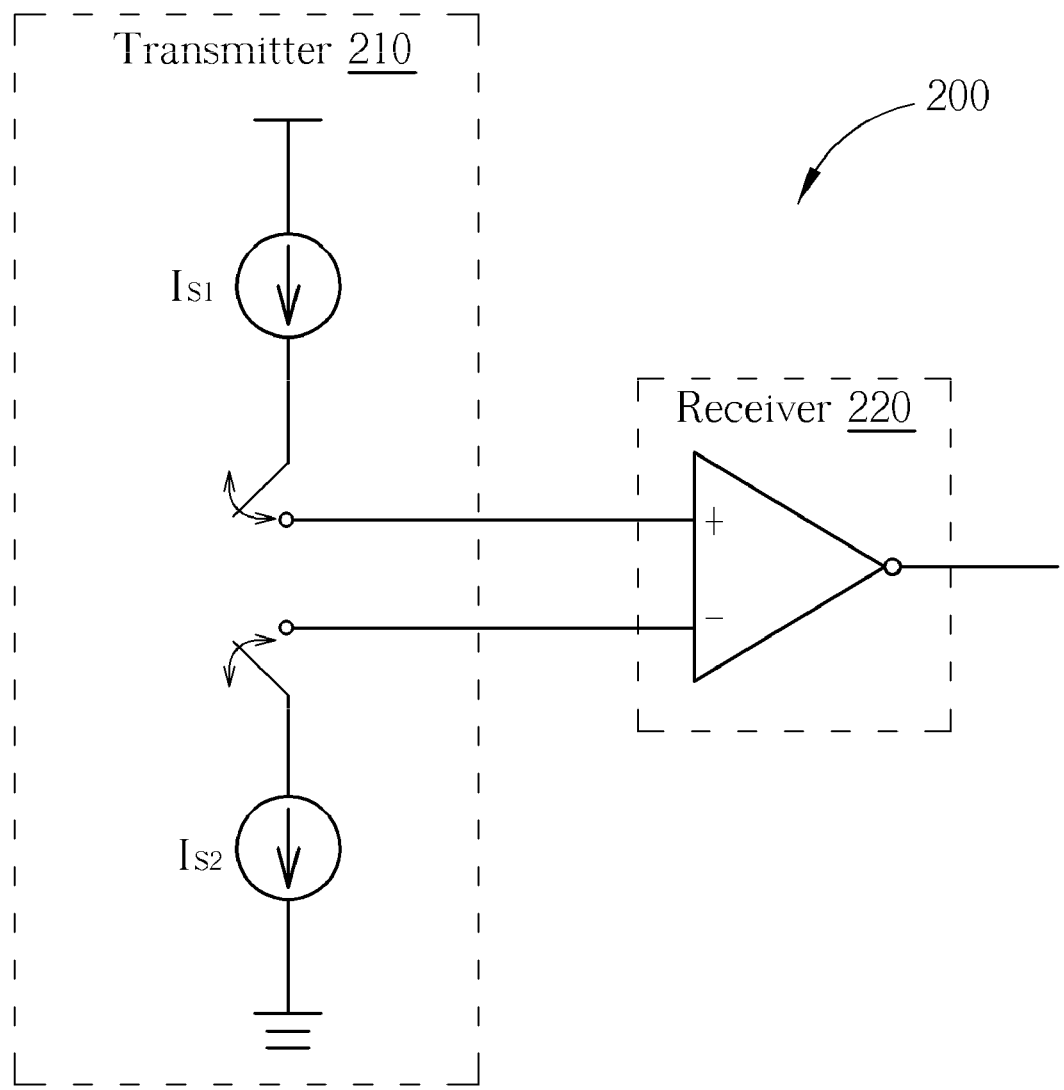
FIG. 2 is a diagram illustrating a prior art circuit for RSDS.
Figure 3:
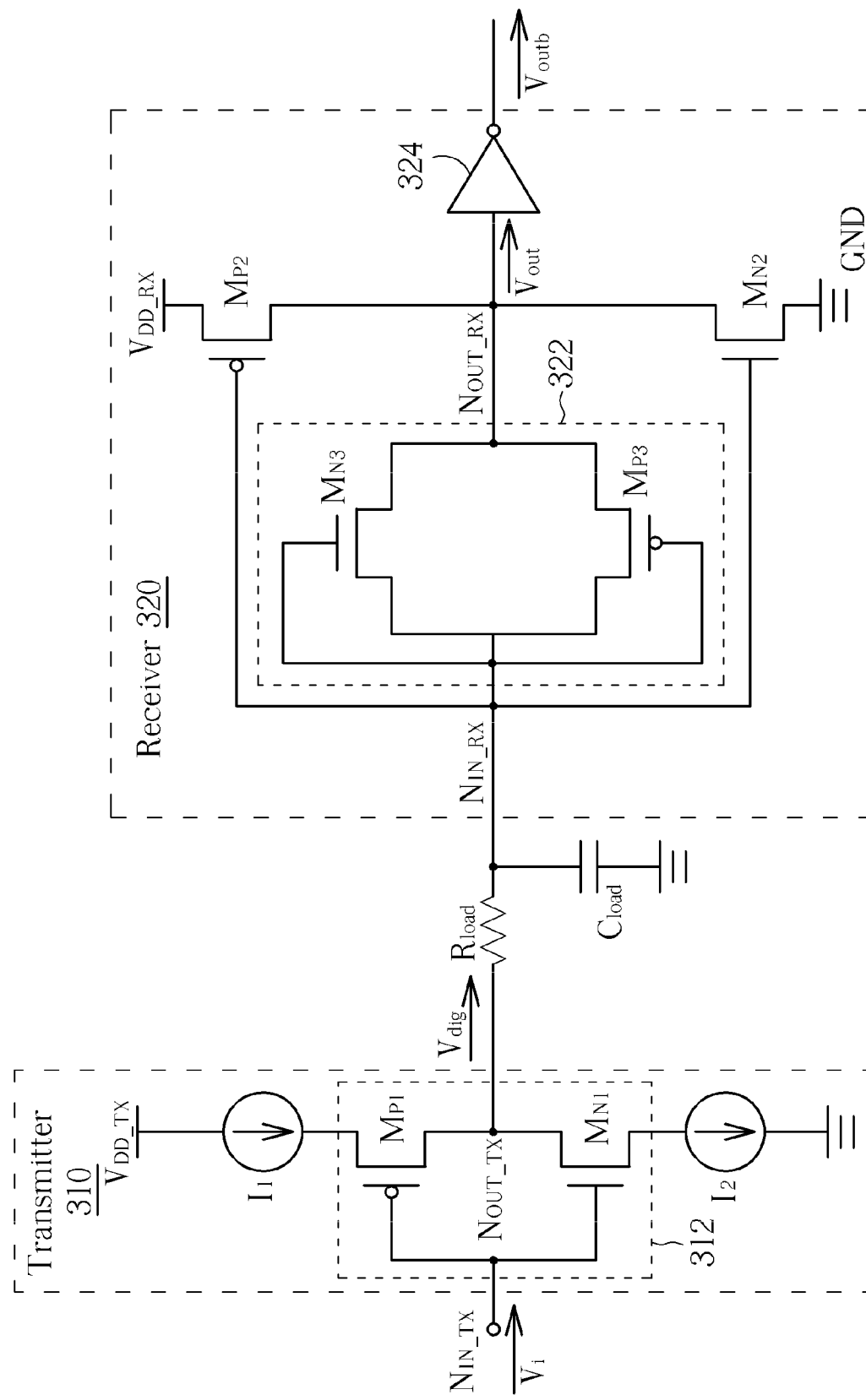
FIG. 3 is a diagram illustrating a transmitter in a timing controller and a receiver in a source driver of a display.

Please refer to FIG. 3. FIG. 3 is a diagram illustrating a transmitter 310 and a receiver 320 according to an embodiment of the invention. The transmitter 310 can be used in a timing controller of a display, while the receiver 320 can be used in a source driver of the display. As shown in FIG. 3, the transmitter 310 includes an inverter 312 and current sources $I_1$ and $I_2$, where the inverter 310 includes a P-type transistor $M_{P1}$ and an N-type transistor $M_{N1}$. The current source $I_1$ supplies a first current to a power node of the inverter 310 and the current source $I_2$ supplies a second current to another power node of the inverter 310.

The receiver 320 includes a first switch $M_{P2}$, a second switch $M_{N2}$, and a voltage-limiting circuit 322. In this embodiment, the first switch $M_{P2}$ is implemented by the P-type transistor and the second switch $M_{N2}$ is implemented by the N-type transistor. Additionally, the voltage-limiting circuit 322 includes a diode-connected N-type transistor $M_{N3}$ and a diode-connected P-type transistor $M_{P3}$. Furthermore, the transmitter 310 is coupled to the receiver 320 via a single data line, where a resistor $R_{load}$ and a capacitor $C_{load}$ shown in FIG. 3 respectively represent an equivalent parasitic resistance and an equivalent parasitic capacitance of the single data line.

In the operations of the transmitter 310 and the receiver 320, the inverter 312 receives an input signal $V_i$ at an input node $N_{IN\_TX}$ and generates a digital signal $V_{dig}$ at an output node $N_{OUT\_TX}$, and the digital signal $V_{dig}$ is then transmitted to an input node $N_{IN\_RX}$ of the receiver 320 via the single data line. The first switch $M_{P2}$ selectively connects an output node $N_{OUT\_RX}$ of the receiver 320 to a first reference voltage $V_{DD\_RX}$ based on the digital signal $V_{dig}$, and the second switch $M_{N2}$ selectively connects the output node $N_{OUT\_RX}$ of the receiver 320 to a second reference voltage GND based on the digital signal $V_{dig}$, and a received signal $V_{out}$ at the output node $N_{OUT\_RX}$ is generated. At the same time, the voltage-limiting circuit 322 limits a voltage level of the input node $N_{IN\_RX}$ of the receiver 320.

The receiver 320 may optionally further include an inverter 324 that inverts the received signal $V_{out}$ to generate an inverted received signal $V_{outb}$. Finally, a channel in the source driver generates a driving voltage based on the inverted received signal $V_{outb}$.

For example, when the input signal $V_i$ is at a state of logic "0" (lower voltage level), the current path between the transmitter 310 and the receiver 320 is from the current source $I_1$, and through the P-type transistor $M_{P1}$, the single data line, the input node $N_{IN\_RX}$ of the receiver 320, the N-type transistor $M_{N3}$, the N-type transistor $M_{N2}$, and eventually into a node having the second reference voltage GND. At this time, the voltage level of the input node $N_{IN\_RX}$ of the receiver 320 is a summation of a drain-source voltage $V_{DS}$ of the N-type transistor $M_{N3}$ and a gate-source voltage $V_{GS}$ of the N-type transistor $M_{N2}$, and is less than a supply voltage $V_{DD\_TX}$ of the transmitter 310. The output node $N_{OUT\_RX}$ of the receiver 320 is at the lower voltage level. The threshold voltages of the transistor $M_{N3}$ and $M_{N2}$ are properly designed that the voltage level of the input node $N_{IN\_RX}$ is large enough, at this state, to turn off the transistor $M_{P2}$, so as to prevent transistors $M_{P2}$ and $M_{N2}$ from simultaneously being turned on.

Similarly, when the input signal Vi is at a state of logic "1" (higher voltage level), the current path in the transmitter 310 and the receiver 320 is from the P-type transistor $M_{P2}$, and through the output node $N_{OUT\_RX}$ of the receiver 320, the P-type transistor $M_{P3}$, the input node $N_{IN\_RX}$ of the receiver 320, the single data line, the N-type transistor $M_{N1}$, the current source $I_2$, and eventually into the ground. At this time, the voltage level of the input node $N_{IN\_RX}$ of the receiver 320 is a difference between the first reference voltage $V_{DD\_RX}$ and a summation of a drain-source voltage $V_{DS}$ of the P-type transistor $M_{P2}$ and a gate-source voltage $V_{GS}$ of the P-type transistor $M_{P3}$, and is greater than the ground voltage of the transmitter 310. The output node $N_{OUT\_RX}$ of the receiver 320 is at a higher voltage level. The threshold voltages of the transistor $M_{P3}$ and $M_{P2}$ are properly designed that the voltage level of the input node $N_{IN\_RX}$ is small enough, at this state, to turn off the transistor $M_{N2}$, so as to prevent transistors $M_{P2}$ and $M_{N2}$ from simultaneously being turned on.

Taking 1.8 volt as $V_{DD\_RX}$ and $V_{DD\_TX}$, a swing of the digital signal $V_{dig}$ of the present invention is about 1 volt (0.4V-1.4V), which is much lower than the swing (0-1.8V) of the signal in the TTL 100. Therefore, the display provided by the present invention has better EMI and operating frequency. Furthermore, because the receiver 320 is connected to the transmitter 310 via the single data line, the layout is less complex.

In addition, in the circuit 200, the current sources $I_{s1}$ and $I_{s2}$ in the transmitter 210 require to supply higher currents (about 2 mA) to the data lines to maintain the constant voltage on the data lines. In the present invention, however, the constant voltage (a middle voltage of the digital signal $V_{dig}$) is generated by the transmitter 310 and the receiver 320 themselves. Therefore, the current source $I_1$ and $I_2$ only need to supply lower currents (about 100 uA) to the single data line to maintain the constant voltage.

It is noted that, in the present invention, the transmitter 310 is implemented in the timing controller. However, this arrangement is for illustrative purposes only and is not intended to limit the implementation at the timing controller. The transmitter 310 can be implemented between any control circuit and the source driver, and these alternative designs are all within the scope of the present invention.

In addition, in this embodiment, the receiver 320 includes the inverter 324 and the channel in the source driver generates the driving voltage based on the inverted received signal $V_{outb}$. However, in other embodiments of the present invention, the inverter 324 can be removed from the receiver 320, and the channel in the source driver generates the driving voltage based on the received signal $V_{out}$.

Figure 4:
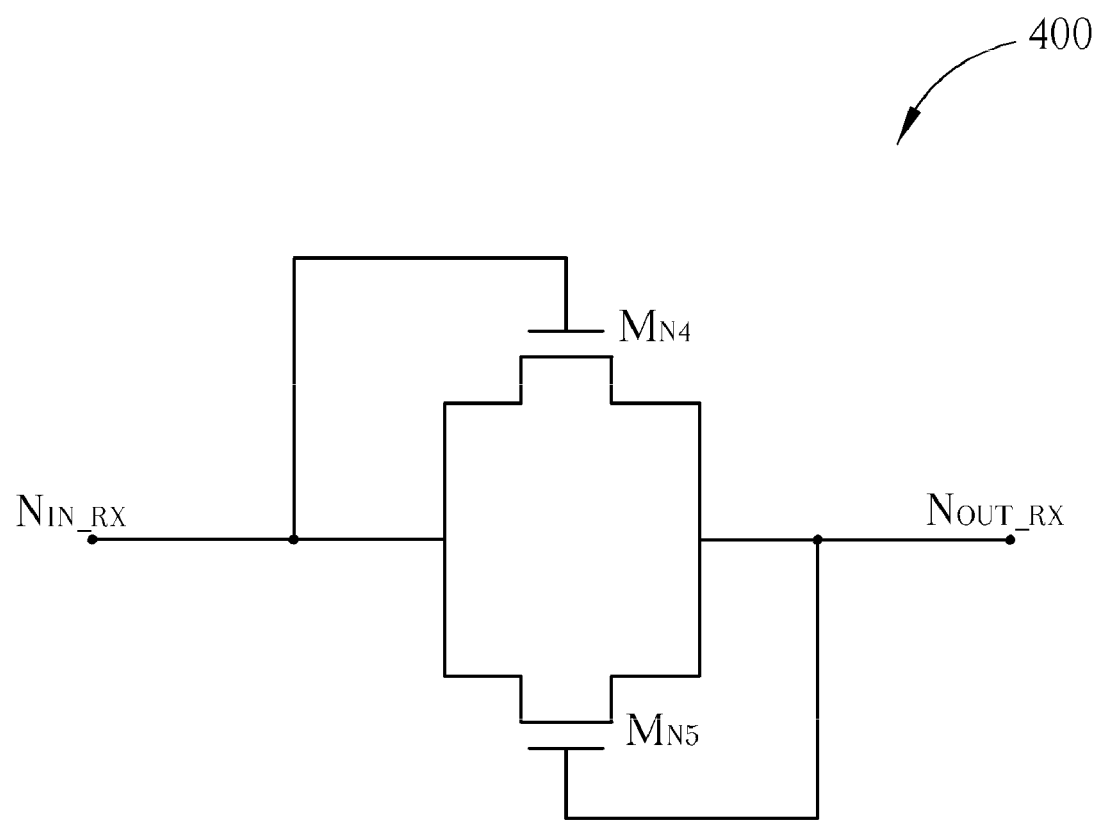
FIG. 4 is another embodiment of the voltage-limiting circuit shown in FIG. 3.
Figure 5:
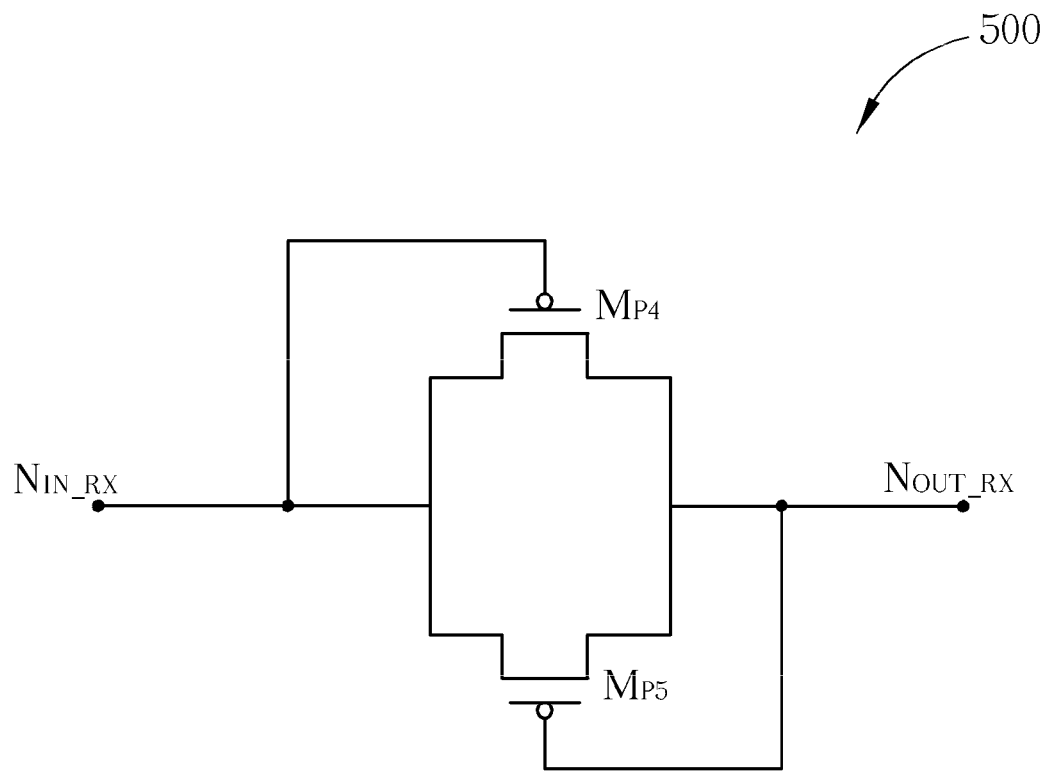
FIG. 5 is a further embodiment of the voltage-limiting circuit shown in FIG. 3.

FIG. 4 and FIG. 5 are other embodiments of the voltage-limiting circuit of the present invention. In FIG. 4, a voltage-limiting circuit 400 includes a first N-type transistor $M_{N4}$ and a second N-type transistor $M_{N5}$, where the first N-type transistor $M_{N4}$ and the second N-type transistor $M_{N5}$ are diode-connected and coupled between the input node $N_{IN\_RX}$ and the output node $N_{OUT\_RX}$ of the receiver 320, a gate terminal of the first N-type transistor $M_{N4}$ is connected to the input node $N_{IN\_RX}$ of the receiver 320, and a gate terminal of the second N-type transistor $M_{N5}$ is connected to the output node $N_{OUT\_RX}$ of the receiver 320. In FIG. 5, a voltage-limiting circuit 500 includes a first P-type transistor $M_{P4}$ and a second P-type transistor $M_{P5}$, where the first P-type transistor $M_{P4}$ and the second P-type transistor $M_{P5}$ are diode-connected and coupled between the input node $N_{IN\_RX}$ and the output node $N_{OUT\_RX}$ of the receiver 320, and a gate terminal of the first P-type transistor $M_{P4}$ is connected to the input node $N_{IN\_RX}$ of the receiver 320, and a gate terminal of the second P-type transistor $M_{P5}$ is connected to the output node $N_{OUT\_RX}$ of the receiver 320.

Those skilled in the art will readily observe that numerous modifications and alterations of the device and method may be made while retaining the teachings of the invention.

What is claimed is:

1. A source driver, comprising:
a receiver for receiving a digital signal at an input node to generate a received signal at an output node, comprising:
a first switch having a control node directly connected to the input node of the receiver, for receiving the digital signal at the control node of the first switch, and selectively connecting the output node of the receiver to a first reference voltage based on the digital signal;
a second switch having a control node directly connected to the input node of the receiver, for receiving the digital signal at the control node of the second switch, and selectively connecting the output node of the receiver to a second reference voltage based on the digital signal;
a voltage-limiting circuit, coupled between the input node and the output node of the receiver, for limiting a voltage level of the input node of the receiver; and
a channel, for generating a driving voltage based on the received signal.

2. The source driver of the claim 1, wherein the receiver further comprises:
an inverter coupled between the output node and the channel.

3. The data transmission system of the claim 1, wherein the voltage-limiting circuit comprises:
a diode-connected transistor coupled between the input node and the output node of the receiver.

4. The data transmission system of the claim 1, wherein the voltage-limiting circuit includes:
a P-type transistor coupled between the input node and the output node of the receiver, wherein a gate terminal of the P-type transistor is connected to the input node of the receiver; and an N-type transistor coupled between the input node and the output node of the receiver, wherein a gate terminal of the N-type transistor is connected to the input node of the receiver.

5. The source driver of the claim 1, wherein the voltage-limiting circuit includes:
a first N-type transistor coupled between the input node and the output node of the receiver, wherein a gate terminal of the first N-type transistor is connected to the input node of the receiver; and
a second N-type transistor coupled between the input node and the output node of the receiver, wherein a gate terminal of the second N-type transistor is connected to the output node of the receiver.

6. The source driver of the claim 1, wherein the voltage-limiting circuit includes:
a first P-type transistor coupled between the input node and the output node of the receiver, wherein a gate terminal of the first P-type transistor is connected to the input node of the receiver; and
a second P-type transistor coupled between the input node and the output node of the receiver, wherein a gate terminal of the second P-type transistor is connected to the output node of the receiver.

7. The source driver of the claim 1, wherein the first switch is a P-type transistor, the second switch is an N-type transistor, and the first reference voltage is greater than the second reference voltage.

8. A display comprising:
a timing controller for receiving an input signal to generate a digital signal, comprising:
an inverter, having an input node for receiving the input signal and generating the digital signal at an output node;
a first current source for supplying a first current to a first power node of the inverter; and
a second current source for supplying a second current to a second power node of the inverter; and
a source driver comprising a receiver and a channel, coupled to the output node of the inverter via a single data line, for receiving the digital signal from the timing controller via the single data line without via any other data line;
wherein the receiver is utilized for receiving the digital signal at an input node of the receiver to generate a received signal at an output node of the receiver, and the receiver comprises:
a first switch having a control node directly connected to the input node of the receiver, for receiving the digital signal at the control node of the first switch, and selectively connecting the output node of the receiver to a first reference voltage based on the digital signal;
a second switch having a control node directly connected to the input node of the receiver, for receiving the digital signal at the control node of the second switch, and selectively connecting the output node of the receiver to a second reference voltage based on the digital signal; and
a voltage-limiting circuit, coupled between the input node and the output node of the receiver, for limiting a voltage level of the input node of the receiver; and
wherein the channel generates a driving voltage based on the received signal.

9. The display of the claim 8, wherein the receiver further comprises:
an inverter coupled between the output node of the receiver and the channel.

10. The display of the claim 8, wherein the voltage-limiting circuit comprises:
a diode-connected transistor coupled between the input node and the output node of the receiver.

11. The display of the claim 8, wherein the voltage-limiting circuit includes:
a P-type transistor coupled between the input node and the output node of the receiver, wherein a gate terminal of the P-type transistor is connected to the input node of the receiver; and
an N-type transistor coupled between the input node and the output node of the receiver, wherein a gate terminal of the N-type transistor is connected to the input node of the receiver.

12. The display of the claim 8, wherein the voltage-limiting circuit includes:
a first N-type transistor coupled between the input node and the output node of the receiver, wherein a gate terminal of the first N-type transistor is connected to the input node of the receiver; and
a second N-type transistor coupled between the input node and the output node of the receiver, wherein a gate terminal of the second N-type transistor is connected to the output node of the receiver.

13. The display of the claim 8, wherein the voltage-limiting circuit includes:
a first P-type transistor coupled between the input node and the output node of the receiver, wherein a gate terminal of the first P-type transistor is connected to the input node of the receiver; and
a second P-type transistor coupled between the input node and the output node of the receiver, wherein a gate terminal of the second P-type transistor is connected to the output node of the receiver.

14. The display of the claim 8, wherein the first switch is a P-type transistor, the second switch is an N-type transistor, and the first reference voltage is greater than the second reference voltage.

* * * * *